US011201102B2

(12) United States Patent
Parida et al.

(10) Patent No.: US 11,201,102 B2
(45) Date of Patent: Dec. 14, 2021

(54) MODULE LID WITH EMBEDDED TWO-PHASE COOLING AND INSULATING LAYER

(71) Applicant: International Business Machines Corporation, Armonk, NY (US)

(72) Inventors: Pritish R. Parida, Stamford, CT (US); Timothy J. Chainer, Putnam Valley, NY (US); Mark D. Schultz, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 349 days.

(21) Appl. No.: 15/976,725

(22) Filed: May 10, 2018

(65) Prior Publication Data

US 2019/0348345 A1    Nov. 14, 2019

(51) Int. Cl.
*H01L 23/427* (2006.01)
*H01L 21/48* (2006.01)
(Continued)

(52) U.S. Cl.
CPC ............ *H01L 23/427* (2013.01); *F28D 15/04* (2013.01); *H01L 21/4882* (2013.01);
(Continued)

(58) Field of Classification Search
CPC ... F28D 15/04; H01L 23/427; H01L 21/4882; H01L 23/04; H01L 24/16; H01L 24/32;
(Continued)

(56) References Cited

U.S. PATENT DOCUMENTS 3,817,321 A * 6/1974 Von Cube ............... H01L 24/01
165/104.22
6,317,326 B1 * 11/2001 Vogel .................... H01L 23/473
165/80.4
(Continued)

FOREIGN PATENT DOCUMENTS

EP    1519646 A2    3/2005

OTHER PUBLICATIONS

Dale R. Thompson, Vaporizable Dielectric Fluid Cooling of IGBT Power Semiconductors for Vehicle Powertrains, Sep. 2009, IEEE, p. 1 (Year: 2009).*
(Continued)

*Primary Examiner* — Tho V Duong
*Assistant Examiner* — Raheena R Malik
(74) *Attorney, Agent, or Firm* — Daniel Morris; Michael J. Chang, LLC

(57) ABSTRACT

Techniques for integrating two-phase cooling into a microprocessor chip package lid are provided. In one aspect, a vapor chamber lid device includes: an evaporator plate; a condenser plate attached to the evaporator plate such that a cavity is formed between the evaporator plate and the condenser plate; a thermal insulation layer sandwiched between the evaporator plate and the condenser plate; and a working fluid enclosed within the cavity, wherein the working fluid partially fills the cavity. At least one heat-dissipating device can be placed in thermal contact with the evaporator plate via a thermal interface material. A method is also provided for forming the vapor chamber lid device.

15 Claims, 5 Drawing Sheets

(51) Int. Cl.
*H01L 23/04* (2006.01)
*F28D 15/04* (2006.01)
*H01L 23/00* (2006.01)
*H01L 25/065* (2006.01)

(52) U.S. Cl.
CPC .............. *H01L 23/04* (2013.01); *H01L 24/16* (2013.01); *H01L 24/32* (2013.01); *H01L 24/33* (2013.01); *H01L 24/73* (2013.01); *H01L 25/0655* (2013.01); *H01L 2224/16225* (2013.01); *H01L 2224/32225* (2013.01); *H01L 2224/32245* (2013.01); *H01L 2224/33181* (2013.01); *H01L 2224/73204* (2013.01); *H01L 2224/73253* (2013.01); *H01L 2924/1432* (2013.01); *H01L 2924/1433* (2013.01); *H01L 2924/1434* (2013.01)

(58) Field of Classification Search
CPC ..... H01L 24/33; H01L 24/73; H01L 25/0655; H01L 2224/16225; H01L 2224/32225; H01L 2224/33181; H01L 2224/32245; H01L 2224/73253; H01L 2224/73204; H01L 2924/1434; H01L 2924/1433; H01L 2924/1432
USPC ........................................................ 165/80.4
See application file for complete search history.

(56) References Cited

U.S. PATENT DOCUMENTS

| | | | |
|---|---|---|---|
| 6,330,907 B1 * | 12/2001 | Ogushi | F28D 15/043 165/104.26 |
| 6,367,263 B1 * | 4/2002 | Scott | F25B 1/02 165/104.26 |
| 6,367,543 B1 * | 4/2002 | Calaman | F28F 3/022 165/134.1 |
| 6,698,503 B2 * | 3/2004 | Son | F28D 15/043 165/104.26 |
| 7,011,146 B2 * | 3/2006 | Wong | F28D 15/0233 165/104.26 |
| 7,044,201 B2 * | 5/2006 | Cho | F28D 15/0233 165/104.26 |
| 7,980,295 B2 | 7/2011 | Takamatsu et al. | |
| 8,051,905 B2 * | 11/2011 | Arik | H01L 23/4735 165/287 |
| 8,256,501 B2 * | 9/2012 | Nagai | F28D 15/0233 165/80.4 |
| 8,970,029 B2 * | 3/2015 | Lin | H01L 23/04 257/719 |
| 9,301,557 B1 * | 4/2016 | Santos | B32B 27/08 |
| 9,557,118 B2 | 1/2017 | Salamon et al. | |
| 9,713,285 B2 | 7/2017 | Cader et al. | |
| 9,778,709 B2 | 10/2017 | So et al. | |
| 9,831,151 B1 * | 11/2017 | Schultz | H01L 23/467 |
| 2004/0055322 A1 | 3/2004 | Monfarad | |
| 2010/0296249 A1 | 11/2010 | Li | |
| 2016/0123637 A1 | 5/2016 | Moreno et al. | |
| 2018/0356156 A1 * | 12/2018 | Hurbi | F28F 13/182 |

OTHER PUBLICATIONS

Mitsuo Hashimoto et al., "Nano-Structured Two-Phase Heat Spreader for Cooling Ultra-High Heat Flux Sources," Proceedings of the 14th International Heat Transfer Conference IHTC14 (Aug. 2010) (11 pages).

Bar-Cohen et al., "DARPA's Intra/Interchip Enhanced Cooling (ICECool) Program," CS Mantech Conference, pp. 171-174 (May 2013).

Zhang et al., "Recent Advances in Flip-Chip Underfill: Materials, Process, and Reliability," IEEE Transactions on Advanced Packaging, vol. 27, No. 3, pp. 515-524 (Aug. 2004).

* cited by examiner

MODULE LID WITH EMBEDDED TWO-PHASE COOLING AND INSULATING LAYER

FIELD OF THE INVENTION

The present invention relates to thermal management in integrated circuits such as microprocessor chips, and more particularly, to techniques for integrating two-phase cooling into a microprocessor chip package lid with thermal insulation.

BACKGROUND OF THE INVENTION

During operation, integrated circuits such as microprocessor chips generate heat. Typically, this heat is removed using an air-cooled chip package whereby heat from the chip is transferred to a lid over the chip which acts as a heat spreader. The lid, in turn, is thermally connected to a heat sink which dissipates the heat through convective air cooling.

However, the heat density in integrated circuits such as microprocessor chips is increasing. Thus, in order to maintain safe operating temperatures, advancements in thermal management techniques are required.

Advances in thermal management for integrated circuits include embedding cooling into the chip package design. See, for example, Bar-Cohen et al., "DARPA's Intra/Interchip Enhanced Cooling (ICECool) Program," CS MANTECH Conference, pgs. 171-174 (May 2013) (hereinafter "Bar-Cohen"). In this approach, a coolant is pumped through microchannels in the package is used to remove heat from the chip. With this system however, replacement of device components would require breakable connections to the coolant system, which is not feasible for a pressurized system.

Thus, improved techniques for embedded two-phase cooling for integrated circuits such as microprocessor chips would be desirable.

SUMMARY OF THE INVENTION

The present invention provides techniques for integrating two-phase cooling into a microprocessor chip package lid with thermal insulation. In one aspect of the invention, a vapor chamber lid device is provided. The device includes: an evaporator plate; a condenser plate attached to the evaporator plate such that a cavity is formed between the evaporator plate and the condenser plate; a thermal insulation layer sandwiched between the evaporator plate and the condenser plate; and a working fluid enclosed within the cavity, wherein the working fluid partially fills the cavity.

In another aspect of the invention, another vapor chamber lid device is provided. The device includes: an evaporator plate; a condenser plate attached to the evaporator plate such that a cavity is formed between the evaporator plate and the condenser plate; a thermal insulation layer sandwiched between the evaporator plate and the condenser plate; a working fluid enclosed within the cavity, wherein the working fluid partially fills the cavity; and at least one heat-dissipating device in thermal contact with the evaporator plate via a thermal interface material.

In yet another aspect of the invention, a method of forming a vapor chamber lid device is provided. The method includes: forming a recess in a front surface and a back surface of an evaporator plate; patterning microstructures in a condenser plate; depositing a thermal insulation layer onto the condenser plate over the microstructures; assembling the evaporator plate to the condenser plate with the thermal insulation layer sandwiched between the evaporator plate and the condenser plate, whereby the recess in the front surface of the evaporator plate forms a cavity between the evaporator plate and the condenser plate; partially filling the cavity with a working fluid; and positioning the evaporator plate and the condenser plate over at least one heat-dissipating device such that the at least one heat-dissipating device is in thermal contact with the evaporator plate.

A more complete understanding of the present invention, as well as further features and advantages of the present invention, will be obtained by reference to the following detailed description and drawings.

DETAILED DESCRIPTION OF PREFERRED EMBODIMENTS

Figure 1:
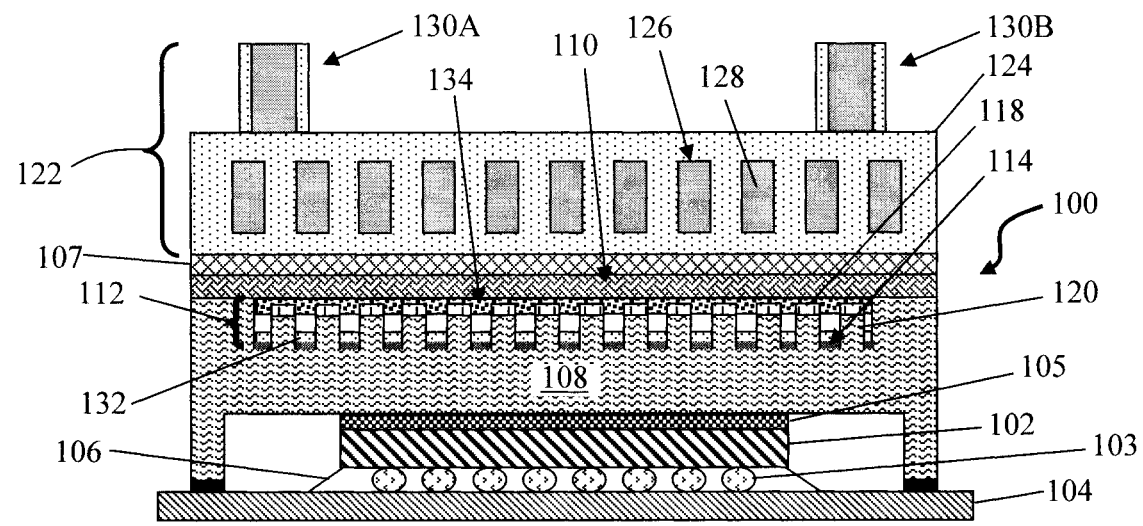
FIG. 1 is a diagram illustrating an exemplary vapor chamber (VC)-lid having an evaporator plate attached to a condenser plate such that a cavity is formed between the plates and a working fluid enclosed with the cavity, a cold plate assembled to the condenser plate, and a heat-dissipating device in thermal contact with the evaporator plate according to an embodiment of the present invention.

Provided herein are techniques for integrating two-phase cooling, wherein the traditional heat spreader or module lid for integrated circuits such as microprocessor chips is replaced with an integrated two-phase cooling lid, referred to herein as a vapor chamber lid (or VC-lid), without compromising its structural rigidity. In the VC-lid design, evaporation and condensation functions for cooling are incorporated into a single lid structure.

As described above, the heat density in integrated circuits such as a microprocessor chips, is increasing and in order to maintain safe operating temperatures, advancement in thermal management techniques is required. Recent advancements involve embedding cooling into the chip package design (ICECool). See, for example, Bar-Cohen, the contents of which are incorporated by reference as if fully set forth herein. This embedded cooling technology, has demonstrated significant thermal performance improvements over the baseline air-cooled system in terms of minimizing thermal resistance and achieving a lower temperature gradient between the chip junction and the local refrigerant temperature. Moreover, effective use of latent heat in phase change heat transfer mitigates the issue of junction temperature rise across the chip when compared against a single-phase water cooling solution or conventional air-cooled solution.

In commercial systems, the heat generated by a complementary-metal oxide semiconductor (CMOS) processor core is conducted through a silicon (Si) die about 700 micrometers ($\mu m$) to about 800 $\mu m$ thick through a thermal interface material (or TIM) providing thermal contact between the die and a heat spreader/lid often made of copper. The heat spreader/lid is attached through a second thermal interface material to an air-cooled heat sink which conducts heat to the room ambient environment.

To use an illustrative non-limiting example, the ambient temperature in a data center is typically about 25° C. The total thermal resistance for a conventional air-cooled server is about 0.24° C. per watt (° C./W), which for a 250 W central processing unit (CPU) would result in a 60° C. temperature gradient between the ambient and processor core, and a processor core temperature of 85° C. Embedded cooling technology (ICECool) has been shown to lower the thermal resistance to about 0.04° C./W or less, thereby reducing the junction temperature which is highly desirable to minimize processor power consumption with respect to similar computational throughput.

A lower thermal resistance enables year-round outdoor ambient cooling of the data center thereby reducing the cooling energy required to transfer the chip heat to the outdoor ambient environment. However, a lot of complexities are involved in making embedded cooling technology a viable alternative. For example, in order to replace a failed chip, it is necessary to either change the entire cooling sub-system or break connections while trying to prevent coolant from leaking. Thus, the development of safer and better methods of parts replacement are needed. Advantageously, the present VC-lid design provides embedded liquid-cooled modules that are field replaceable.

Conventional heat spreaders or module lids spread the heat over a relatively larger area to facilitate heat dissipation. However, due to the physical constraints such as thermal conductivity of the spreader material, the amount of heat spreading that can be achieved is limited. This in turn limits the heat density as well as the total heat that can be safely mitigated from the microprocessor chips.

Advantageously, the present techniques leverage other modes of heat transfer including convection, boiling, evaporation and condensation to extend the heat spreading limit. As will be described in detail below, this improved design is achieved by encasing a cavity having micrometer ($\mu m$)-scale channels and features, within the module lid. The cavity is vacuum cleaned and then partially filled with a (dielectric) working fluid up to a desired vapor pressure. During the electronic device operation, heat from the device will cause the working fluid in the cavity to boil and/or evaporate at the surface closer to the device (i.e., the evaporator surface) and convert to vapor. The vapor generated in this process will then flow to the cooler section of the lid, that is, the cavity surface away from the device (i.e., the condenser surface) where it condenses to liquid. The liquid is then wicked back to the evaporator surface, and the process repeats. See, for example, FIG. 1.

FIG. 1 is a diagram illustrating an exemplary VC-lid design 100 in accordance with the present techniques. As shown in FIG. 1, VC-lid 100 is present over a heat-dissipating device 102, such as a microprocessor chip(s) (e.g., chip or chip stack—see below). In the case of a microprocessor chip(s), for example, the heat-dissipating device 102 can be attached to a substrate 104 (such as a printed circuit board) via solder bumps 103 with underfill 106. Underfill 106 redistributes thermomechanical stress created by coefficient of thermal expansion (CTE) mismatch between the chip and the substrate. See, for example, Zhang et al., "Recent Advances in Flip-Chip Underfill: Materials, Process, and Reliability," IEEE Transactions on Advanced Packaging, vol. 27, no. 3, pgs. 515-524 (August 2004), the contents of which are incorporated by reference as if fully set forth herein.

Advantageously, with the present VC-lid designs, two-phase cooling via a working fluid enclosed between an evaporator plate and a condenser plate is used to efficiently and effectively transfer heat from the heat-dissipating device 102. Further, this two-phase cooling system is integrated into the lid design. Therefore, implementing the present VC-lid design does not involve increasing the overall footprint of the chip package.

In general, the present VC-lid 100 includes an evaporator plate 108 and a condenser plate 110 attached to the evaporator plate 108, such that a cavity 112 is formed between the evaporator plate 108 and the condenser plate 110. See FIG. 1. The side of the cavity 112 defined by the evaporator plate 108 is also referred to herein as the "evaporator side" and the side of the cavity 112 defined by the condenser plate 110 is also referred to herein as the "condenser side."

As shown in FIG. 1, the top of the heat-dissipating device 102 is attached to the VC-lid 100 by way of a (first) thermal interface material (TIM 1) 105 between the heat-dissipating device 102 and the evaporator plate 108. In turn, the top, outer surface of the VC-lid 100 is attached to a cooling apparatus 122 by way of a (second) thermal interface material (TIM 2) 107 between the condenser plate 110 and the cooling apparatus 122. Suitable thermal interface materials include, but are not limited to, solder, a liquid metal thermal interface (such as a liquid metal alloy), thermal grease, a conductive particle filled organic thermal paste or gel (e.g., a particle impregnated polymer) and/or a phase change material.

The role of the cooling apparatus 122 is to reduce the temperature of the condenser plate 110 (e.g., relative to the evaporator plate 108). By way of example only, the cooling apparatus 122 can be a cold plate as shown in FIG. 1, or an air-cooled heat sink (see FIG. 2, described below). Namely, in the example depicted in FIG. 1, cooling apparatus 122 is a cold plate having a metal (e.g., copper) plate 124 containing a plurality of channels 126. The channels 126 contain a working fluid 128. In this case, since the cold plate is not in the vicinity of the chip, water can be used as the working fluid, i.e., cooling apparatus 122 can be a water-cooled cold plate. Ports 130A and 130B permit cooled working fluid to be circulated through the channels 126. For instance, working fluid from an external air-cooled chiller (not shown) can be introduced to the cold plate via one of the ports, say port 130A. As it passes through the channels 126, the working fluid absorbs heat from the condenser plate 110. This warmed working fluid can be extracted from the channels 126 via the other port 130B and sent back to the chiller. By way of this process, a continuous stream of cold working fluid is circulated through the cold plate.

A working fluid 114 is enclosed within (and partially filling) the cavity 112. During operation, heat from the heat-dissipating device 102 (which is in thermal contact with the evaporator plate 108) is transferred to the working fluid 114 within cavity 112. This heat transfer causes the working fluid 114 to evaporate forming a vapor which carries the heat load through cavity 112, to the condenser plate 110. At the condenser plate 110 (which is at a lower temperature than the evaporator plate 108), the vapor condenses back to a liquid while dissipating the heat load. The cooled liquid (i.e., working fluid 114) then runs back down to evaporator plate 108, and the cycle is repeated.

Suitable working fluids 114 include, but are not limited to, water and/or a dielectric fluid. A dielectric fluid is preferable for use around electronic components where electrically conductive coolants, such as water, can pose risks. By way of example only, suitable dielectric fluids include, but are not limited to, 1,3,3,3-Tetrafluoropropene (i.e., R1234ze), 1,1,1,2-Tetrafluoroethane (i.e., R134a), 1,1,1,3,3-Pentafluoropropane (i.e., R245fa) and/or ammonia ($NH_3$).

A thermal insulation layer 118 is sandwiched between the evaporator plate 108 and the condenser plate 110. The role of the thermal insulation layer 118 is several-fold. First, thermal insulation layer 118 provides mechanical support/rigidity for maintaining the shape of cavity 112 during assembly. For instance, assembly of chips onto a motherboard is often done by pick and place machinery that grabs assembled chip packages and places them on the motherboard at the correct location for bonding. This process involves applying force onto the chip package. Without some physical support at the center of the cavity 112, this force might end up collapsing the cavity 112. Second, the thermal insulation layer 118 thermally isolates the evaporator plate 108 from the condenser plate 110. Thus, during operation, heat transfer between these two plates occurs through the working fluid 114. The thermal insulation layer 118 can be made of a curable epoxy that provides the structural strength to the chamber inside the lid while ensuring a thermal isolation between the evaporator and the condenser surfaces. By way of example only, the thermal insulation layer 118 can be a phenoxy thermoplastic adhesive (e.g., a synthetic thermoplastic in the form of polyhydroxy ethers). For example, the phenoxy thermoplastic adhesive can include a phenoxy polymer containing the chemical ingredient bisphenol-A-(epichlorohydrin) (e.g., PKHC, PKHB, PKHJ, PKHA, and PKHH), or the like in a solvent (e.g., N-Methyl-2-pyrrolidone (NMP), Methyl Ethyl Ketone (MEK), cyclohexanone, and/or glycol ethers). According to an exemplary embodiment, the thermal insulation layer 118 has a thickness of from about 2 micrometers (μm) to about 5 μm, and ranges therebetween, for example, from about 3 μm to about 4 μm, and ranges therebetween.

As shown in FIG. 1, microstructures 120, such as fins, pins, etc., can be present on the surface of the evaporator plate 108 within the cavity 112. These microstructures 120 serve to increase the surface area of the evaporator plate 108. Fins are high-aspect ratio structures that extend laterally along the surface of the evaporator plate 108 whereas pins, also having a high-aspect ratio, are pillar-like structures that extend up from the surface of the evaporator plate 108. As will be described in detail below, microstructures 120 can be patterned in the evaporator plate 108 prior to joining the evaporator plate 108 with the condenser plate 110. As shown in FIG. 1, the thermal insulation layer 118 is sandwiched between the microstructures 120 and the condenser plate 110. Doing so provides structural support for the VC-lid 100 during chip assembly. For instance, if unsupported, downward force on VC-lid 100 during a pick and place procedure could collapse the cavity 112. In this case, however, the microstructures 102 and thermal insulation layer 118 form solid supporting pillars between the evaporator side and the condenser side of the cavity 112.

A wicking structure 132 is employed (in this case at the base of the microstructures 120) to maintain a liquid film on the evaporator side. Namely, the wicking structure 132 wicks the working fluid 114 that drips down from the condenser plate 110 and holds it against the evaporator plate, i.e., keeping the evaporator side of cavity 112 wetted. The wicking structure 132 enables a thin liquid film of the working fluid 114 to be present over the surface of evaporator plate 108 leading to thin film evaporation when heat is applied from the heat-dissipating device 102. As highlighted above, the vapors thus formed will move within the cavity 112 to the surface of the condenser plate 110 where the vapors will condense and drip back down onto the evaporator side surface where the evaporation/condensation process begins again. The wicking structure 132 can be made from sintered copper particles (e.g., spherical particles with a diameter of from about 10 μm to about 50 μm, and ranges therebetween). The wicking structure 132 can also be made from a braided screen having micro-gaps of the order of from about 1 μm to about 25 μm, and ranges therebetween. Yet another approach to making wicking structure 132 is to create high-aspect-ratio grooves having a width of from about 0.1 μm to about 25 μm, and a height of about 100 μm. These high-aspect-ratio groves can be created by machining or through chemical etching processes.

As shown in FIG. 1, microfeatures 134 can also be employed at the condenser side of cavity 112. Microfeatures 134 serve to enhance condensation by providing condensation sites. As will be described in detail below, these microfeatures 134 can be formed by sintering spherical (e.g., metal or ceramic) particles onto the condenser plate. Like structure 132, microfeatures 134 wick the working fluid 114 to keep the condenser side of the cavity 112 wetted.

The goal of VC-lid 100 is to reduce the temperature variation across the lid (i.e., in the plane of the lid) and also the temperature variation between the cooling apparatus 122 and the lid. Advantageously, VC-lid 100 is designed such that these two temperature variations are lowered synchronously. For that to occur, the difference between the temperature of the condenser plate 110 wall (i.e., the surface of the condenser plate facing into the cavity 112), i.e., Twall_cond, and the temperature of the working fluid 114, i.e., Tlid_fluid (Tlid_fluid−Twall_cond) has to be lowered, as well as the difference between the temperature of the evaporator plate 108 wall (i.e., the surface of the evaporator plate facing into cavity 112), i.e., Twall_evap, and the temperature of the working fluid 114 (Twall_evap−Tlid_fluid). In general, Twall_evap>Tlid_fluid>Twall_cond. The evaporator side metal (e.g., Cu) temperature is generally higher than the working fluid 114 saturation temperature. Evaporator side microstructures 120 and wicking structure 132 help reduce the temperature difference (wall to fluid). The condenser side metal temperature is lower than the working fluid 114 saturation temperature. The microfeatures 134 on the condenser side provide condensation sites and also help reduce the temperature delta (wall to fluid). A thermal gradient must exist between the condenser side and evaporator side, hence thermal insulation layer 118 creates a thermal isolation between the two.

Notably, the vapor flow in the cavity 112 is what helps in the spreading of the heat across (in the plane of) the lid. Preferably, the spacing/density of microstructures 120 (e.g., fins/pins) is optimized so as to enhance the heat transfer rate across the evaporator and condenser plates while providing structural support to the lid and sufficient open space within the cavity 112 to allow the vapors to travel quickly from the hot evaporator region to coolest regions of the lid and get condensed back to liquid.

Figure 2:
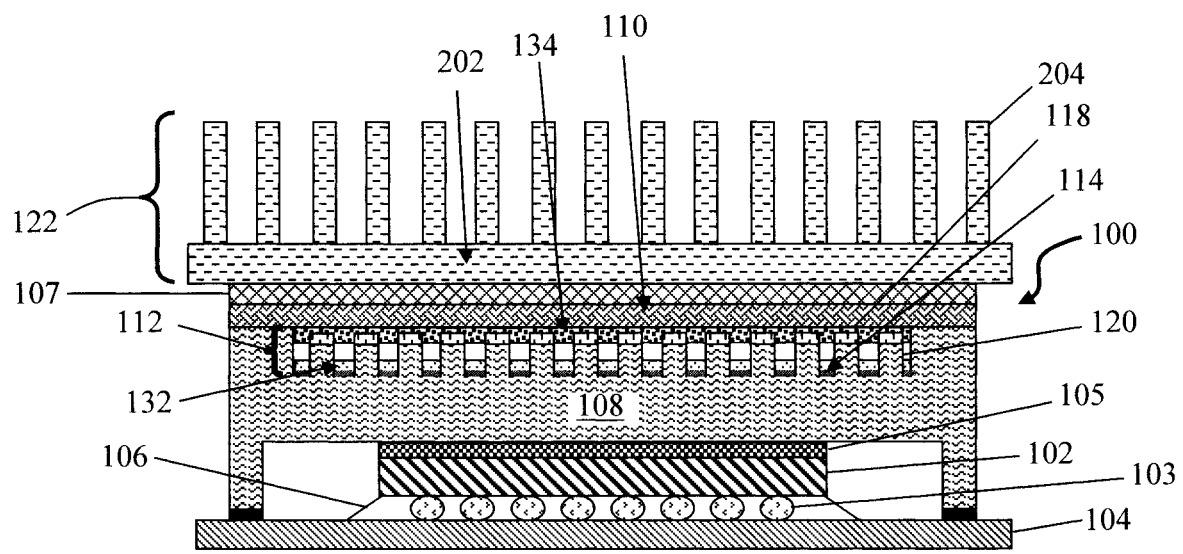
FIG. 2 is a diagram illustrating an exemplary VC-lid with an air-cooled heat sink assembled to the condenser plate according to an embodiment of the present invention.

As described above, cooling apparatus 122 can also be configured as an air-cooled heat sink. See, for example, FIG. 2. FIG. 2 is a diagram illustrating the present VC-lid 100 being used in conjunction with an air-cooled heat sink. Like structures are numbered alike in FIG. 1 and FIG. 2 (and throughout the other figures described herein). As shown in FIG. 2, the air-cooled heat sink includes a metal (e.g., copper) plate 202 having a plurality of fins 204. During operation, convective air flow through the fins 204 draws heat from the metal plate 202, in turn cooling the condenser plate 110.

Figure 3:
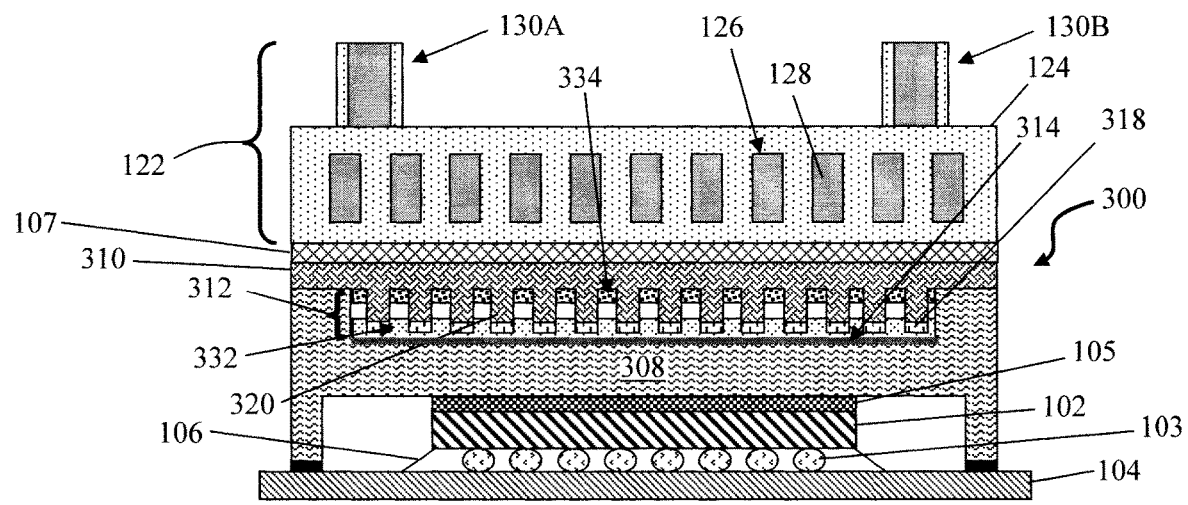
FIG. 3 is a diagram illustrating an exemplary VC-lid with microstructures extending into the cavity from a surface of the condenser plate according to an embodiment of the present invention.

Generally, the condenser side heat transfer (HT) rate is slower than the evaporator side HT rate. To account for this discrepancy, according to an alternative embodiment, the surface area on the condenser side of cavity 112 is increased to improve the condenser side HT rate. See, for example, exemplary VC-lid 300 shown in FIG. 3. As shown in FIG. 3, microstructures 320, such as fins, pins, etc., can instead be located on the condenser side of cavity 312 (as compared to the location of microstructures 120 in FIGS. 1 and 2 on the evaporator side of cavity 112). As provided above, like structures are numbered alike throughout the figures.

Like the VC-lid designs above, VC-lid 300 includes an evaporator plate 308 attached to a condenser plate 310 such that a cavity 312 is formed between the two plates. The notable difference in VC-lid 300 is that microstructures 320 (e.g., fins, pins, etc.) extend into cavity 312 from the condenser side (rather than from the evaporator side). As above, a wicking structure 332 is employed to maintain a liquid film (of working fluid 314) on the evaporator side, i.e., keeping the evaporator side of cavity 312 wetted which leads to thin film evaporation when heat is applied from the heat-dissipating device 102. Similarly, microfeatures 334 (e.g., sintered metal or ceramic particles) wick the working fluid 314 to keep the condenser side of the cavity 312 wetted.

The notion here is that since the predominant heat transfer on the evaporator side is evaporation which occurs at the liquid-vapor interface above the wicking structure 332, then the use of microstructures 320 (e.g., fins, pins, etc.) is less relevant on the evaporator side. Namely, if the characteristic length scale of the wicking structures 332 is small enough (e.g., from about 0.1 micrometer (μm) to about 3 μm, and ranges therebetween), then the wicking force will be sufficient to circulate the coolant within the cavity 312. For instance, the capillary pressure responsible for wicking the liquid through the wick structure is proportional to surface tension of the working fluid divided by the length scale of the gaps in the wick structure. So for a given fluid, the smaller the gaps, the higher the capillary pressure which helps keep the wick structure wetted with the working fluid.

It is notable, however, that an advantage to having microstructures 320 (e.g., fins, pins, etc.) on the evaporator side is that they enhance the evaporator side heat transfer rate locally. Thus, these fins/pins are of advantage when the heat source is spatially non-uniform. Higher density fins can be placed corresponding to the known hot-spot regions of the heat source.

As shown in FIG. 3, a thermal insulation layer 318 is sandwiched between the evaporator plate 308 and the condenser plate 310 which, as described above, provides mechanical support and thermal isolation between the two plates. Suitable thermal insulation materials were provided above. Here, however, since the microstructures 320 extend into cavity 312 from the condenser side (rather than from the evaporator side), the thermal insulation layer 318 is sandwiched between the microstructures 320 and the evaporator plate 310.

As highlighted above, the present VC-lid designs can be used for cooling multiple heat-dissipating devices 402a,b,c, etc. See, for example, FIG. 4. For instance, the heat-dissipating devices 402a,b,c can include multi-chip modules. A notable challenge associated with cooling multi-chip modules is that one chip can have geometrical dimensions (e.g., length, width and/or height) that are different from another chip. For instance, each chip in the module could be an accelerator chip, a graphic processing unit (GPU) chip, a central processing unit (CPU) chip, a memory die, an application-specific integrated circuit (ASIC) chip, or any combination thereof. Combinations of these different types of chips invariably lead to different geometries. Thus, accommodating chips of different sizes under the same lid, while maintaining proper thermal contact is an important design consideration.

Figure 4:
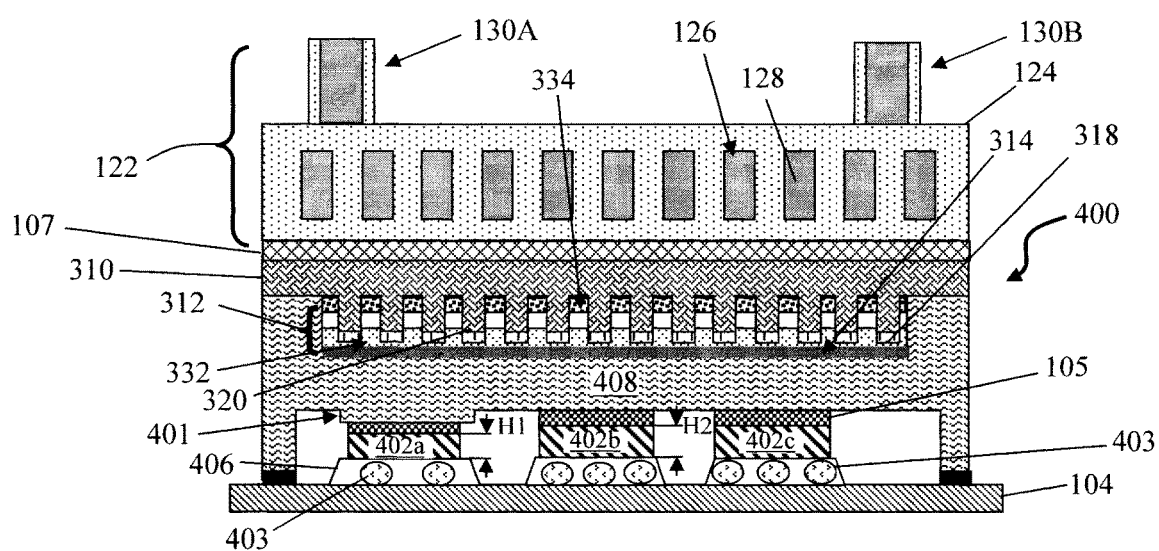
FIG. 4 is a diagram illustrating an exemplary VC-lid with a pedestal on the evaporator plate to account for height differences amongst multiple heat-dissipating devices according to an embodiment of the present invention.

In the example shown in FIG. 4, multiple heat-dissipating devices 402a,b,c are located under the same VC-lid 400. In the same manner as above, each heat-dissipating device 402a,b,c is attached to the substrate 104 via solder bumps 403 and underfill 406. As shown in FIG. 4, there are height variations amongst the heat-dissipating devices 402a,b,c. VC-lid 400 is configured similar to VC-lid 300 of FIG. 3 (wherein like structures are numbered alike), except that the evaporator plate 408 is modified to include pedestals to adjust to height variations between the heat-dissipating devices 402a,b,c. Namely, in the example shown in FIG. 4, heat-dissipating device 402A has a height H1, whereas heat-dissipating devices 402B and 402C have a height H2, wherein H2>H1. If one were to simply place a flat lid over these devices, the greater height H2 would likely prevent the evaporator plate from contacting the shorter device 402A.

However, by incorporating a pedestal(s) 401 into the evaporator plate 408 design above the heat-dissipating devices, the height differences can be accommodated. Thus, when evaporator plate 408 is positioned over the heat-dissipating devices 402a,b,c (with thermal interface material 105 therebetween), proper thermal contact is made with each device. It is notable that pedestals can be incorporated into the evaporator plate design of any of the present VC-lid configurations in the same manner to accommodate for height differences amongst multiple heat-dissipating devices.

Similarly, the present VC-lid designs can also be configured to accommodate three-dimensional (3D) stacks of (multiple) heat-dissipating devices. See FIG. 5. Namely, building on the pedestal concept, the evaporator plate 508 employed in FIG. 5 has regions both with and without pedestals and, where pedestals are present, the pedestals can have varied depths to accommodate the 3D stack(s) of devices and/or devices having differing heights.

Figure 5:
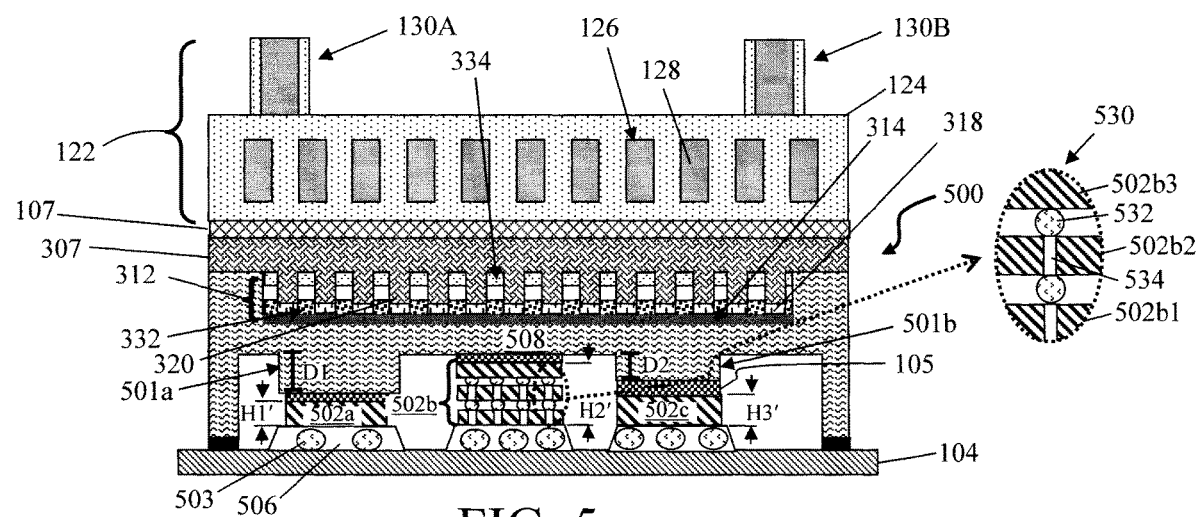
FIG. 5 is a diagram illustrating an exemplary VC-lid with multiple pedestals of differing depths on the evaporator plate to account for height differences amongst the multiple heat-dissipating devices according to an embodiment of the present invention.

Namely, as shown in to FIG. 5, multiple heat-dissipating devices 502a,b,c are located under the same VC-lid 500. In the same manner as above, each heat-dissipating device 502a,b,c is attached to the substrate 104 via solder bumps 503 and underfill 506. As shown in FIG. 5, heat-dissipating device 502b is a 3D stack of heat-dissipating devices 502b1, 502b2, 502b3, etc. (see inset 530), wherein the layers of the stack are interconnected by solder bumps 532 and vias 534. Further, the heat-dissipating devices 502a and 502c have different heights from one another. Thus, the heat-dissipating devices 502a,b,c provide a topography across the surface of substrate 104 including at least three different heights, H1', H2' and H3', wherein H2'>H3'>H1'. To accommodate the devices of these varying heights, pedestals (of varying depths D1 and D2, wherein D1>D2) are selectively placed on the bottom of the evaporator plate 508. Specifically, pedestals 501a and 501b are present in regions of the evaporator plate 508 over heat-dissipating devices 502a and 502c, respectively, and absent from the region of evaporator plate 508 over heat-dissipating device 502b. Thus, when evaporator plate 508 is positioned over the heat-dissipating devices 502a,b,c (with thermal interface material 105 therebetween), proper thermal contact is made with each device and 3D device stack.

Figure 6:
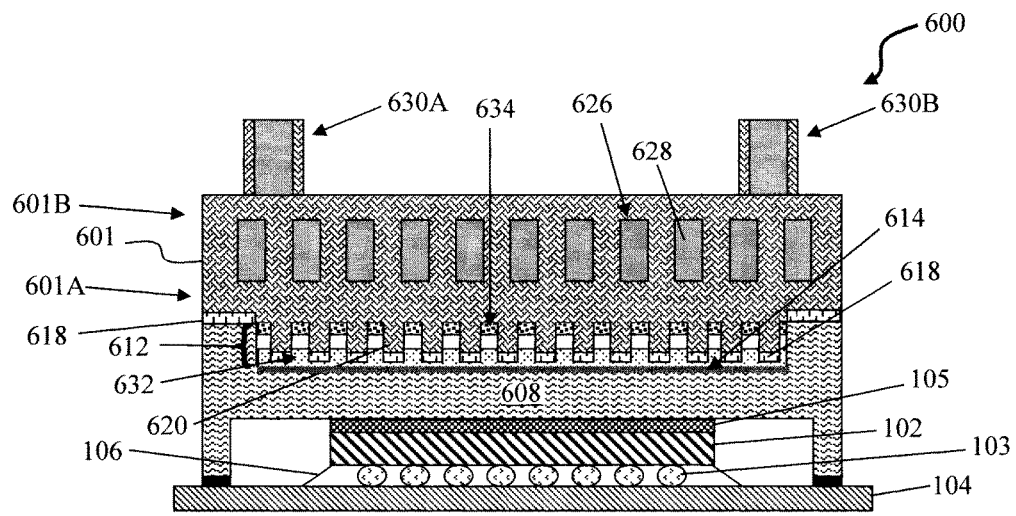
FIG. 6 is a diagram illustrating an exemplary VC-lid with an integrated cold plate and condenser according to an embodiment of the present invention.

Another variant of the present VC-lid design is shown illustrated in FIG. 6 where a cold plate (or alternatively an air-cooled heat sink) is integrated into the condenser plate. Namely, VC-lid 600 shown in FIG. 6 includes a single plate 601 that has a condenser in one region 601A and a cold plate in another region 601B. In the same manner as described above, the condenser region of plate 601 is attached to an evaporator plate 608, such that a cavity 612 is formed between an evaporator plate 608 and the condenser region 601A of plate 601 and, in this example, microstructures 620 (e.g., fins, pins, etc.) extend into the cavity 612 from the condenser side. A working fluid 614 partially fills the cavity 612.

A wicking structure 632 is employed on the evaporator side of cavity 612 and microfeatures 634 (e.g., sintered metal or ceramic particles) are employed on the condenser side 601A of cavity 612. As described above, the wicking structure 632/microfeatures 634 serve to wick the working fluid 614 to keep the respective evaporator/condenser sides of the cavity 612 wetted.

The cold plate region 601B of plate 601 includes a plurality of channels 626 which contain a working fluid 628 (e.g., water). In the same manner as described above, ports 630A and 630B permit cooled working fluid 628 to be introduced to the channels 626 and warmed working fluid to be removed from the channels 626, respectively.

As shown in FIG. 6, a thermal insulation layer 618 is sandwiched between the evaporator plate 608 and the condenser region 601A of plate 601 within cavity 612 which, as described above, provides mechanical support and thermal isolation between the two plates. Suitable thermal insulation materials were provided above. As an optional variant, this thermal insulation layer 618 can also be present between the evaporator plate 608 and the condenser region 601A of plate 601 outside of cavity 612. Doing so provides complete physical and thermal isolation between the evaporator and condenser plates, i.e., the evaporator plate 608 and the condenser region 601A of plate 601 are not anywhere in direct physical contact with one another. As such, any thermal cross talk between these plates is prevented.

Figure 7:
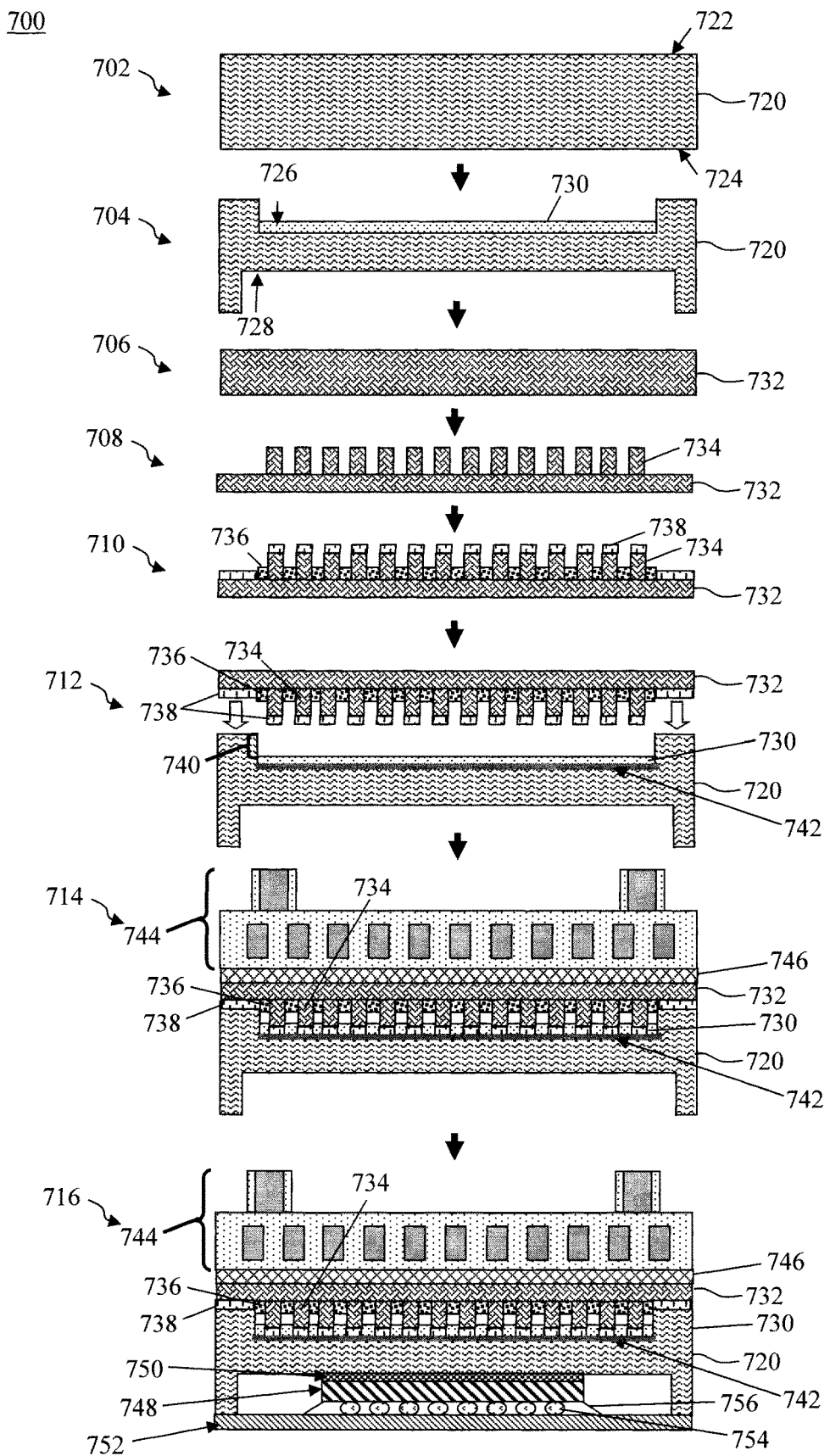
FIG. 7 is a diagram illustrating an exemplary methodology for forming the present VC-lid according to an embodiment of the present invention.

FIG. 7 is a diagram illustrating an exemplary methodology 700 for fabricating the present VC-lid. While presented in a particular order, the steps of methodology 700 can be performed in a sequence other than what is shown in FIG. 7. For instance, formation of the evaporator plate and the condenser plate can be performed in any order, or concurrently in a given manufacturing process. As shown in step 702, an evaporator plate 720 is provided having a front surface 722 and a back surface 724. Suitable materials for the evaporator plate 720 include, but are not limited to, metals such as copper (Cu) and/or aluminum (Al).

In step 704, recesses 726 and 728 are formed in the front surface 722 and the back surface 724 of the evaporator plate 720. Optionally, forming the recess 728 can involve forming pedestals (not shown) of various depths on the back surface of the evaporator plate 720. As described above, these pedestals ensure that proper thermal contact is made with heat-dissipating devices of varying heights.

A wicking structure 730 is then formed on the front surface of the evaporator plate 720 within the recess 726. As provided above, the wicking structure 730 helps to keep the evaporator plate 720 wetted with the working fluid. The wicking structure 730 can be made from sintered copper particles (e.g., spherical particles with a diameter of from about 10 µm to about 50 µm, and ranges therebetween). The wicking structure 730 can also be made from a braided screen having micro-gaps of the order of from about 1 µm to about 25 µm, and ranges therebetween. Yet another approach to making wicking structure 730 is to create high-aspect-ratio grooves having a width of from about 0.1 µm to about 25 µm, and a height of about 100 µm. These high-aspect-ratio groves can be created by machining or through chemical etching processes.

Figure 8:
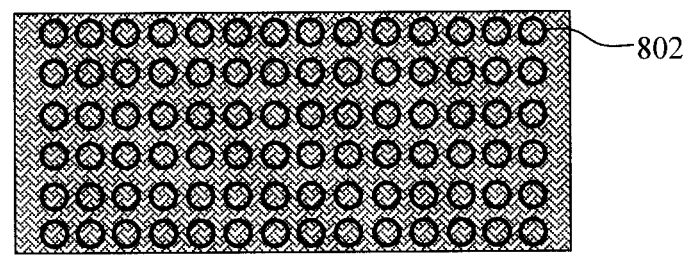
FIG. 8 is a diagram illustrating microstructures configured as pins according to an embodiment of the present invention.
Figure 9:
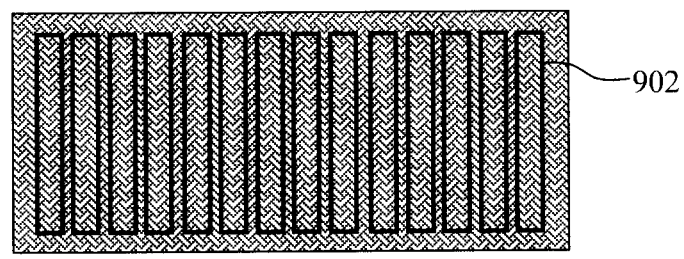
FIG. 9 is a diagram illustrating microstructures configured as fins according to an embodiment of the present invention.

In step 706, a condenser plate 732 is provided. Suitable materials for the condenser plate 732 include, but are not limited to, metals such as Cu and/or Al. In this particular example, microstructures 734 (e.g., fins, pins, etc.) are next formed in the condenser plate 732—see step 708. However, as provided above, these microstructures could instead be patterned in the evaporator plate 720. Referring briefly to FIG. 8 and FIG. 9, top-down illustrations are shown of the microstructures 734 configured as pins 802 or as fins 902, respectively.

In step 710, microfeatures 736 are formed on the condenser plate 732 (at the base of the microstructures 734). According to an exemplary embodiment, microfeatures 736 are formed by sintering spherical metal (e.g., Cu and/or Al) or ceramic particles onto the condenser plate 732.

A thermal insulation layer 738 is then deposited onto the condenser plate 732 (including over the microstructures 734) both inside and outside of the regions of the condenser plate 732 that will define the cavity (with evaporator plate 720). Thus, in this example, complete physical and thermal isolation will be achieved (via the thermal insulation layer 738) between the evaporator and condenser plates. Suitable materials for the thermal insulation layer 738 include, but are not limited to, a curable epoxy.

In step 712, the evaporator plate 720 is assembled to the condenser plate 732 with the thermal insulation layer 738 sandwiched in between the two plates. As shown in step 712, this assembly of the evaporator plate 720 and the condenser plate 732 forms a cavity 740 therebetween, with the microstructures 734 extending into the cavity 740. Prior to completing sealing of the cavity 740, a working fluid 742 is introduced to the cavity 740. The amount of working fluid 742 used is such that the fluid only partially fills the cavity 740. Suitable working fluids include, but are not limited to, dielectric fluids such as R1234ze, R134a, R245fa and/or $NH_3$.

In step 714, a cold plate 744 is assembled to the condenser plate 732 with a thermal interface material 746 therebetween. Suitable thermal interface materials include, but are not limited to, solder, a liquid metal thermal interface (such as a liquid metal alloy), thermal grease, a conductive particle filled organic thermal paste or gel (e.g., a particle impregnated polymer) and/or a phase change material. While a cold plate 744 is used in this particular example, other cooling apparatus can be employed such as an air-cooled heat sink (see above). Further, as provided above, the cold plate or air-cooled heat sink can be integrated into the condenser plate design (as a single unit), thereby eliminating the need for the thermal interface material 746.

Finally, in step 716, the assembled evaporator plate 720 and condenser plate 732 are positioned over at least one heat-dissipating device 748 (e.g., a microprocessor chip(s)) with a thermal interface material 750 between the evaporator plate 720 and the heat-dissipating device 748 (such that the heat-dissipating device 748 is in direct thermal contact with the evaporator plate 720). Suitable thermal interface materials were provided above. In the same manner as described above, the heat-dissipating device 748 is mounted on a substrate 752 via solder bumps 754 with underfill 756.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A device, comprising:
   an evaporator plate;
   a condenser plate attached to the evaporator plate such that a cavity is formed between the evaporator plate and the condenser plate, wherein the condenser plate is in direct contact with the evaporator plate;
   a thermal insulation layer sandwiched between the evaporator plate and the condenser plate;
   a working fluid enclosed within the cavity, wherein the working fluid partially fills the cavity, wherein the cavity formed between the evaporator plate and the condenser plate comprises a single cavity in which both the thermal insulation layer and the working fluid are present; and
   microstructures extending into the cavity from either a surface of the evaporator plate or a surface of the condenser plate, wherein the thermal insulation layer is present either between the microstructures and the condenser plate when the microstructures extend into the cavity from the surface of the evaporator plate, or between the microstructures and the evaporator plate when the microstructures extend into the cavity from the surface of the condenser plate.

2. The device of claim 1, wherein the thermal insulation layer comprises a curable epoxy.

3. The device of claim 1, wherein the working fluid is selected from the group consisting of: water, a dielectric fluid, and combinations thereof.

4. The device of claim 1, wherein the working fluid comprises a dielectric fluid selected from the group consisting of: 3,3,3-Tetrafluoropropene, 1,1,1,2-Tetrafluoroethane, 1,1,1,3,3-Pentafluoropropane, ammonia, and combinations thereof.

5. The device of claim 1, wherein the microstructures are selected from the group consisting of: fins and pins.

6. The device of claim 1, further comprising:
   a wicking structure on a surface of the evaporator plate within the cavity.

7. The device of claim 1, further comprising:
   microfeatures on a surface of the condenser plate within the cavity.

8. The device of claim 7, wherein the microfeatures comprise sintered spherical particles.

9. The device of claim 1, further comprising:
   a cooling apparatus on the condenser plate.

10. The device of claim 9, wherein the cooling apparatus is selected from the group consisting of: a cold plate and an air-cooled heat sink.

11. The device of claim 9, further comprising:
    a thermal interface material between the cooling apparatus and the condenser plate.

12. The device of claim 9, further comprising:
    a single plate comprising both the cooling apparatus and the condenser plate.

13. A device, comprising:
    an evaporator plate;
    a condenser plate attached to the evaporator plate such that a cavity is formed between the evaporator plate and the condenser plate;
    a thermal insulation layer sandwiched between the evaporator plate and the condenser plate;
    a working fluid enclosed within the cavity, wherein the working fluid partially fills the cavity;
    at least one heat-dissipating device in thermal contact with the evaporator plate via a thermal interface material, wherein the cavity formed between the evaporator plate and the condenser plate comprises a single cavity in which both the thermal insulation layer and the working fluid are present; and
    microstructures extending into the cavity from either a surface of the evaporator plate or a surface of the condenser plate, wherein the thermal insulation layer is present either between the microstructures and the condenser plate when the microstructures extend into the cavity from the surface of the evaporator plate, or between the microstructures and the evaporator plate when the microstructures extend into the cavity from the surface of the condenser plate.

14. The device of claim 13, wherein multiple heat-dissipating devices are in thermal contact with the evaporator plate, and wherein the multiple heat-dissipating devices have differing heights, the device further comprising:
    at least one pedestal on a surface of the evaporator plate above the multiple heat-dissipating devices have differing heights.

15. The device of claim 13, wherein the working fluid comprises a dielectric fluid selected from the group consisting of: 3,3,3-Tetrafluoropropene, 1,1,1,2-Tetrafluoroethane, 1,1,1,3,3-Pentafluoropropane, ammonia, and combinations thereof.

* * * * *